United States Patent [19]

Kamuro

[11] Patent Number: 4,651,031
[45] Date of Patent: Mar. 17, 1987

[54] ADDRESS DECODER CIRCUIT

[75] Inventor: Setsufumi Kamuro, Matsudo, Japan

[73] Assignee: Sharp Kabushiki Kaisha, Osaka, Japan

[21] Appl. No.: 797,148

[22] Filed: Nov. 12, 1985

[30] Foreign Application Priority Data

Dec. 18, 1984 [JP] Japan ................... 59-268067

[51] Int. Cl.[4] ................. G11C 80/00; H03K 19/094
[52] U.S. Cl. .................... 307/449; 307/482; 307/463; 365/189; 365/230
[58] Field of Search ............ 307/443, 449, 453, 463, 307/482, 243, 270, 450; 365/230, 189; 340/804

[56] References Cited

FOREIGN PATENT DOCUMENTS 0106234  7/1982  Japan ............................ 307/450

OTHER PUBLICATIONS

"Two-Phase Dynamic Logic with Enhancement Depletion Technology" Falcoz et al.

"On-Chip Redundancy Scheme", Schuster.
"High-Density Multiemitter Transistor Decoder", Weidmann.

Primary Examiner—Stanley D. Miller
Assistant Examiner—M. R. Wambach
Attorney, Agent, or Firm—Flehr, Hohbach, Test, Albritton & Herbert

[57] ABSTRACT

An address decoder circuit of the present invention forms a word line selection signal by entering an m-bit address signal by dividing it into two groups of i bits and (m−i) bits. The decoder output from the i-bit signal is inputted to the gate of a first enhancement-type MOS transistor and that from the (m−i)-bit signal is applied to its source. Its drain is connected to a word line of a memory cell array. An inverter is provided to invert the decoder output from the i-bit signal and the output from the inverter is applied to the gate of a second enhancement-type MOS transistor of which the drain and the source are connected respectively to the word line and a power source terminal.

8 Claims, 3 Drawing Figures

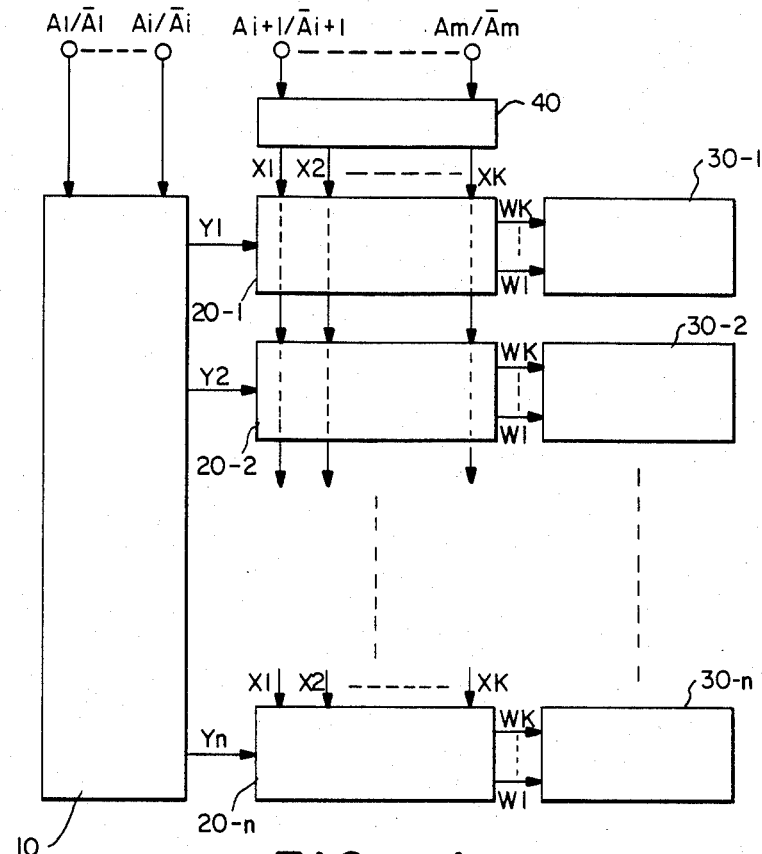
FIG.—1
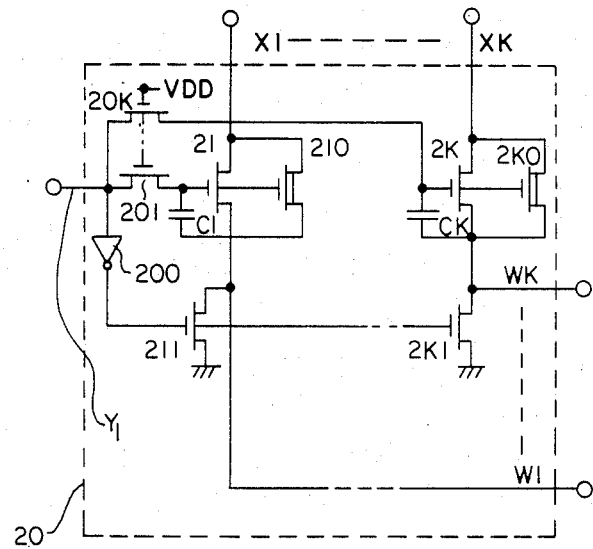
FIG.—3

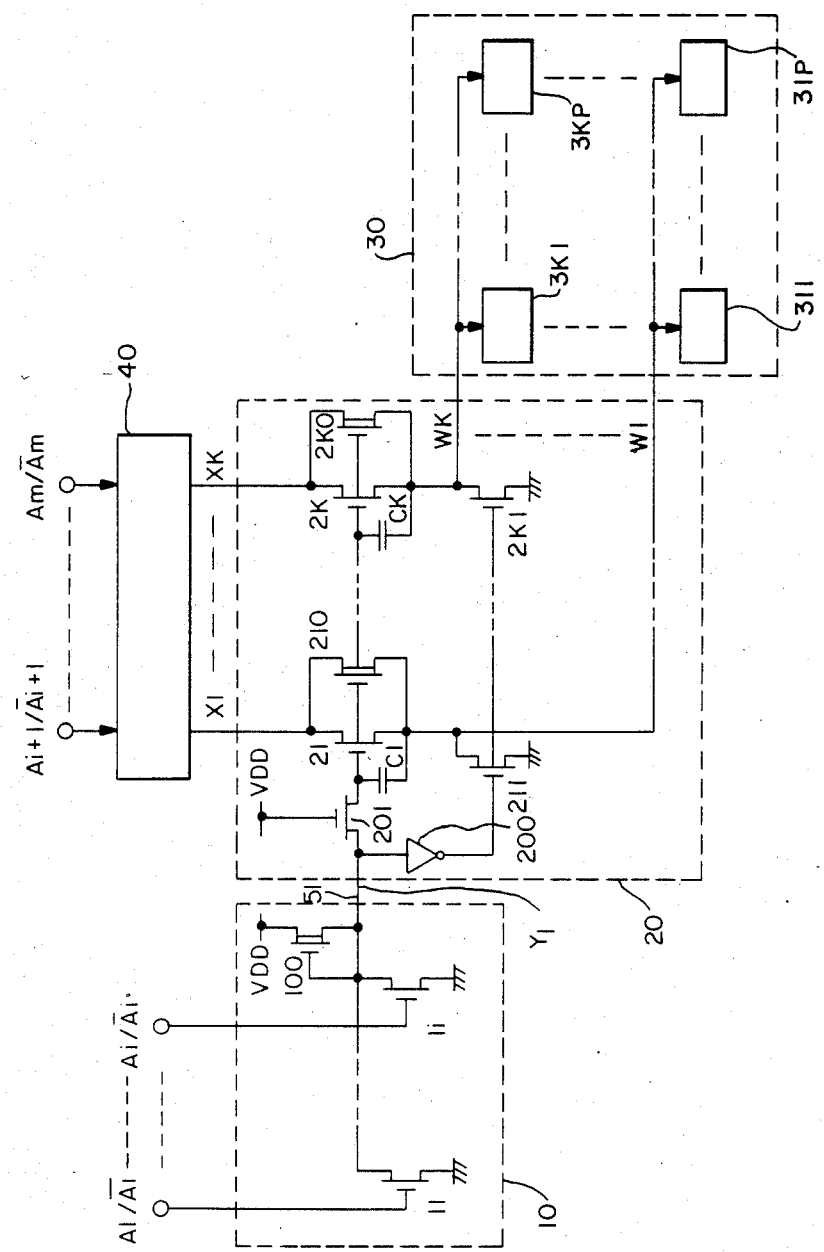
FIG.—2

ADDRESS DECODER CIRCUIT

This invention relates to an address decoder circuit for MOS memories, etc. and more particularly to an address decoder circuit for generating word line selection signals for a memory circuit with memory cells arranged in a matrix formation.

When memory cells are arranged in a matrix formation and connected row-wise to $2^m$ word lines and selection of one among them is to be effected by inputting an m-bit address signal, $2^m$ signal output circuits each with its own word line driving circuit will be used according to a most basic circuit design. Although it is only one of the many word lines that is selected each time by an address signal, direct currents flow also in the output circuits associated with the unselected word lines of which there are many. This means not only that large space is taken up by the large number of address decoder circuits and word line driving circuits but also that a significant amount of electric power is consumed wastefully in these circuits associated with unselected word lines.

It is therefore an object of the present invention to provide an address decoder circuit with reduced power consumption for memory cells in a matrix formation.

It is another object of the present invention to provide an address decoder circuit of a compact structure for memory cells in a matrix formation.

The above and other objects of the present invention are achieved by dividing m-bit address signals inputted to an address decoder circuit into two groups with i and (m−i) bits each and structuring the circuit in such a way that the selection signals from one of the groups will control the ON and OFF conditions of an enhancement-type MOS transistor connected to the address output line of the other group so that formation of current routes can be substantially reduced.

The accompanying drawings, which are incorporated in and form a part of the specification, illustrate embodiments of the present invention and, together with the description, serve to explain the principles of the invention. In the drawings:

FIG. 1 is a structural diagram of an address decoder circuit of the present invention, FIG. 2 is a circuit diagram of a portion of the address decoder circuit of FIG. 1 according to one embodiment of the present invention, and FIG. 3 is a circuit diagram of the word line driving circuit of FIG. 2 according to another embodiment of the present invention.

In what follows, embodiments of the present invention using N-channel MOS transistors will be explained but this is not intended to limit the scope of the present invention because P-channel MOS transistors can be used similarly for the purpose of the present invention.

FIG. 1 shows an address decoder circuit which is adapted to serve n ($=2^i$) memory cell array sections 30-1 . . . 30-n, each containing a plurality of memory cells in a matrix formation with k ($=2^{m-i}$) rows and p columns. An m-bit address signal $A_1/\overline{A}_1 \ldots A_m/\overline{A}_m$ is divided into two groups each with i bits $A_1/\overline{A}_1 \ldots A_i/\overline{A}_i$ and (m-i) bits $A_{i+1}/\overline{A}_{i+1} \ldots A_m/\overline{A}_m$ and they are inputted respectively to a first address decoder circuit 10 adapted to output n signals $Y_1 \ldots Y_n$ and a second address decoder circuit 40 adapted to output k output signals $X_1 \ldots X_k$. There are n word line driving circuits 20-1 . . . 20-n which are individually connected to the n memory cell array sections 30-1 . . . 30-n by k word lines $W_1 \ldots W_k$. The jth word line driving circuit 20-j (j=1 . . . n) is adapted to input the jth output signal $Y_j$ from the first address decoder circuit 10 and the k output signals $X_1 \ldots X_k$ from the second address decoder circuit 40.

The first and second address decoder circuits 10 and 40 are structured similarly. For the sake of simplicity, FIG. 2 shows the structure of only the first word line driving circuit 20-1 and the part of the first address decoder circuit 10 corresponding thereto. The structure of the first memory cell array section 30-1 is also illustrated with memory cells 311 . . . 31p . . . 3k1 . . . 3kp row-wise connected to k word lines $W_1 \ldots W_k$ in a matrix formation with p cells in each row.

Reference being made to FIG. 2, the part of the first address decoder circuit 10 corresponding to the first word line driving circuit 20-1 comprises i MOS transistors 11 . . . 1i connected in parallel relationship with respect to one another to a terminal 51 for outputting a first output signal $Y_1$. The first i bits of an m-bit address signal $A_1/\overline{A}_1 \ldots A_i/\overline{A}_i$ are inputted to their gates as illustrated. A depletion-type MOS transistor 100 is provided as a load between the output terminal 51 and a power source $V_{DD}$. The potential at the terminal 51 is "high" when it is "selected" by the address signal. It is "low" when it is not "selected".

The first output signal $Y_1$, which is formed from an i-bit address signal by the first address decoder circuit 10 and outputted therefrom at the terminal 51, is inputted to the gate of a first enhancement-type MOS transistor 21 through an intermediate enhancement-type MOS transistor 201 and also to the gate of a second enhancement-type MOS transistor 211 through an inverter 200. The gate of the aforementioned intermediate enhancement-type MOS transistor 201 is connected to a power source $V_{DD}$. The source of the first enhancement-type MOS transistor 21 is connected to the first output $X_1$ from the second address decoder circuit 40, serving to receive a signal formed by decoding the (m−i)-bit address signal $A_{i+1}/\overline{A}_{i+1} \ldots A_m/\overline{A}_m$. The drain of the first enhancement-type MOS transistor 21 is connected to the first word line $W_1$ of the first memory cell array 30-1. There is a booster capacitor $C_1$ provided between the gate and the drain of the first enhancement-type MOS transistor 21 and a depletion-type MOS transistor 210 between its source and drain for making up for the potential leak on the selected word line. The gate of this depletion-type MOS transistor 210 is connected in common with the gate of the first enhancement-type MOS transistor 21. The aforementioned capacitor $C_1$ may also make use of the parasitic capacitance between the gate and the channel. The drain of the second enhancement-type MOS transistor 211 is connected to the first word line $W_1$ and the source thereof is grounded.

As shown in FIG. 2, the second address decoder circuit 40 is adapted to decode (m−i)-bit address signals and forms k ($=2^{m-i}$) output signals $X_j$ (j=1 . . . k). For each of these output signals, there is provided a similar circuit comprising two enhancement-type MOS transistors, one depletion-type MOS transistor and a capacitor (not shown in FIG. 2 except for those corresponding to $X_1$ and $X_k$). The gates of the first enhancement-type MOS transistor 2j and the depletion-type MOS transistor 2j0 and those of the second enhancement-type MOS transistor 2j1 (j=1 . . . k) are connected in common to the intermediate MOS transistor 201 and the inverter 200 at one side and to the individual word lines $W_1 \ldots$ $W_k$ at the other side. When the output $Y_1$ at the terminal 51 is "low", therefore, all of the first enhancement-type MOS transistors 21 . . . 2k are in the OFF condition while the output of the inverter 200 is "high" and hence all of the second enhancement-type MOS transistors 211 . . . 2k1 are in the ON condition. As a result, all word lines $W_1 \ldots W_k$ and hence all memory cells in the memory cell array section 30-1 are in the "low" condition or "not selected".

Let us consider next a situation where the output $Y_1$ due to an i-bit address signal is "high". In this situation, gate potentials are applied to the first enhancement-type MOS transistors 21 . . . 2k through the intermediate enhancement-type MOS transistor 201. On the other hand, the output of the inverter 200 is "low", leaving all of the second enhancement-type MOS transistors 211 . . . 2k1 in an OFF condition.

Of the k outputs $X_1 \ldots X_k$ formed by the combination of address signals $A_{i+1}/\overline{A}_{i+1} \ldots A_m/\overline{A}_m$, there is now one of them in the "high" condition, the others being "low". Let us assume now for convenience that $X_1$ is "high" and $X_2 \ldots X_k$ are "low". In this situation, the first word line $W_1$ becomes "high" through the first enhancement-type MOS transistor 21. At this time, the gate potential of the first enhancement-type MOS transistor 21 becomes higher due to the boosting effect of the capacitor $C_1$. As a result, the "high" level of the word line $W_1$ can reach the level of the output $X_1$. As for the remaining outputs $X_2 \ldots X_k$, since they are at "low" levels, they cause the corresponding word lines $W_2 \ldots W_k$ to be "low" through the first enhancement-type MOS transistors 22 . . . 2k which are in the ON condition. In other words, when the output $Y_1$ from the first address decoder circuit 10 is on the "high" level, only one of the word lines $W_1 \ldots W_k$ is "high" corresponding to that one of the outputs $X_1 \ldots X_k$ that is on the "high" level.

Next, the function of the depletion-type MOS transistors 210 . . . 2k0 will be explained. When the level of the first address decoder output $Y_1$ changes from "low" to "high", or when one of the outputs $X_1 \ldots X_k$ from the second address decoder circuit 40 changes from "low" to "high", the gate potential of the first enhancement-type MOS transistors 21 . . . 2k and hence the word line potential can be increased by the boosting effect of the capacitors $C_1 \ldots C_k$. After a long time, however, the gate potential of the first enhancement-type MOS transistors 21 . . . 2k drops due to leakage and this lowers the potential of the word line which is currently being selected. This may not present any problem to certain memory cells or memory systems, but if it is necessary to maintain the word line potential at a high level all the time as in the case of ordinary memory systems, such leakage can be compensated as explained above by providing depletion-type MOS transistors 210 . . . 2k0. In such a situation, the depletion-type MOS transistors are required only to be able to supply enough current so that the word line potential can be maintained at a desired high level.

Power consumption in the address decoder circuit of FIGS. 1 and 2 is low because the only current necessary for its operation is through the inverter 200 and the depletion-type MOS transistors 210 . . . 2k0. Although some power is expended in the driving circuits for the outputs $X_1 \ldots X_k$, the number of outputs k is generally 4, 8 or 16. Conventional circuits without dividing the address signal uses generally 64, 128, 256 or more.

The purpose of the intermediate enhancement-type MOS transistor 201 is to prevent the charges from escaping through the depletion-type MOS transistor 100, etc. to the power source $V_{DD}$ when the booster capacitors $C_1 \ldots C_k$ raise the gate potentials of the enhancement-type MOS transistors 21 . . . 2k. If the load element 100 of the address decoder circuit comprises an enhancement-type MOS transistor, the aforementioned intermediate enhancement-type MOS transistor 201 may be dispensed with.

Another embodiment of the word line driving circuit 20 according to the present invention is depicted in FIG. 3 wherein the same numerals indicate corresponding components shown in FIG. 2. In order to enhance the boosting effects of the capacitors $C_1 \ldots C_k$, third enhancement-type MOS transistors 201 . . . 20k are provided between the gate of the respective first enhancement-type MOS transistors 21 . . . 2k and the output $Y_1$ of the first address decoder circuit. With this structure, each capacitor $C_1 \ldots C_k$ becomes connected to the output $Y_1$ and hence the boosting effect is improved.

In summary, address decoder circuits according to the present invention are structured to substantially reduce the routes of electric currents by dividing address signals into two groups so that a selection signal from one group will control the ON and OFF conditions of enhancement-type MOS transistors connected to the address output lines of the other group. This reduces the rate of power consumption in the circuit. Moreover, the design of layout becomes easier with a chip because the address decoder circuit is constructed in a divided form. The present invention is particularly advantageous, therefore, where the size of memory cells is reduced and the design conditions on peripheral circuits are very strict.

The foregoing description of preferred embodiments of the present invention has been presented for purposes of illustration and description. It is not intended to be exhaustive or to limit the invention to the precise form disclosed, and obviously many modifications and variations are possible in light of the above teachings. Such minor changes and modifications which may be apparent to a person skilled in the art are intended to be included within the scope of this invention.

What is claimed is:

1. An address decoder circuit for forming word line selection signals by applying thereto an m-bit address signal, said decoder circuit comprising
    a first enhancement-type MOS transistor, its gate serving to receive a decoder output from an i-bit address signal (i being smaller than m), its source serving to receive a decoder output from an (m−i)-bit address signal, and its drain being connected to a word line of a memory cell array,
    an inverter for inverting said decoder output from an i-bit address, and
    a second enhancement-type MOS transistor, its gate serving to receive the output from said inverter, its drain being connected to said word line and its source being connected to a power source terminal.

2. The address decoder circuit of claim 1 further comprising
    a capacitor between the gate and the drain of said first enhancement-type MOS transistor and
    a depletion-type MOS transistor, the source thereof being connected to the source of said first enhancement-type MOS transistor, the drain thereof being connected to the drain of said first enhancement-type MOS transistor, and the gate thereof being connected in common with the gate of said first enhancement-type MOS transistor.

3. The address decoder circuit of claim 1 wherein said decoder output from an i-bit address signal is applied through a third enhancement-type MOS transistor to the gate of said first enhancement-type MOS transistor.

4. An address decoder circuit for forming word line selection signals by receiving thereto an m-bit address signal, said decoder circuit comprising
 a first decoder circuit serving to receive an i-bit address signal (i being smaller than m) and to output $2^i$ first decoder output signals,
 a second decoder circuit serving to receive an (m−i)-bit address signal and to output $2^{m-i}$ second decoder output signals, and
 $2^i$ word line driving circuits each serving to receive one of said first decoder output signals and said $2^{m-i}$ second decoder output signals and to output $2^{m-i}$ word line driving signals through $2^{m-i}$ word lines which are each connected to a plurality of memory cells,
 each of said word line driving circuits comprising
 an inverter for inverting one of said first decoder output signals, and
 a plurality of unit circuits each including
  a first enhancement-type MOS transistor of which the gate serves to receive said one of said first decoder output signals, the source serves to receive one of said second decoder output signals and the drain is connected to one of said $2^{m-i}$ word lines, and
  a second enhancement-type MOS transistor of which the gate serves to receive the output from said inverter, the drain is connected to said one of said $2^{m-i}$ word lines and the source is connected to a power source terminal.

5. The address decoder circuit of claim 4 wherein each of said unit circuits further includes
 a capacitor between the gate and the drain of said first enhancement-type MOS transistor, and
 a depletion-type MOS transistor, the source thereof being connected to the source of said first enhancement-type MOS transistor, the drain thereof being connected to the drain of said first enhancement-type MOS transistor, and the gate thereof being connected in common with the gate of said first enhancement-type MOS transistor.

6. The address decoder circuit of claim 4 wherein each of said word line driving circuits further comprises one or more third enhancement-type MOS transistors through which said one of said first decoder output signals is inputted to the gates of said first enhancement-type MOS transistors.

7. The address decoder circuit of claim 2 wherein a decoder output is received through a third enhancement-type MOS transistor to the gate of said first enhancement-type MOS transistor.

8. The address decoder circuit of claim 5 wherein each of said word line driving circuits further comprises one or more third enhancement-type MOS transistors through which said one of said first decoder output signals is applied to the gates of said first enhancement-type MOS transistors.

* * * * *